US012620955B2

(12) United States Patent
Furuya

(10) Patent No.: US 12,620,955 B2
(45) Date of Patent: May 5, 2026

(54) METHOD FOR PROCESSING AUDIO SIGNAL TO BE SUPPLIED TO DEVICE, ELECTRONIC APPARATUS, AND COMPUTER-READABLE RECORDING MEDIUM

(71) Applicant: A&M GROUP INC., Chiba (JP)

(72) Inventor: Hirotoshi Furuya, Chiba (JP)

(73) Assignee: A&M GROUP INC., Chiba (JP)

( * ) Notice: Subject to any disclaimer, the term of this patent is extended or adjusted under 35 U.S.C. 154(b) by 143 days.

(21) Appl. No.: 18/838,366

(22) PCT Filed: Feb. 14, 2023

(86) PCT No.: PCT/JP2023/005053
§ 371 (c)(1),
(2) Date: Aug. 14, 2024

(87) PCT Pub. No.: WO2023/157845
PCT Pub. Date: Aug. 24, 2023

(65) Prior Publication Data
US 2025/0158586 A1      May 15, 2025

(30) Foreign Application Priority Data
Feb. 16, 2022 (JP) ................................. 2022-022511

(51) Int. Cl.
*H03G 5/16* (2006.01)
*G10H 1/06* (2006.01)
(Continued)

(52) U.S. Cl.
CPC ............. *H03G 5/165* (2013.01); *H03G 5/005* (2013.01)

(58) Field of Classification Search
CPC .......... H03G 5/165; H03G 5/005; G10H 1/06; G10H 1/46; H04R 3/04
(Continued)

(56) References Cited

U.S. PATENT DOCUMENTS 9,218,798 B1 * 12/2015 Satoh ....................... G10H 1/18
2018/0330759 A1 * 11/2018 Funakoshi ........... G11B 27/031

FOREIGN PATENT DOCUMENTS

JP     2008-211602 A     9/2008
JP     2009-147629 A     7/2009

OTHER PUBLICATIONS

Office Action issued on Apr. 29, 2025, in corresponding German Application No. 11 2023 000 917.1, 16 pages.
(Continued)

*Primary Examiner* — Thjuan K Addy
(74) *Attorney, Agent, or Firm* — Maier & Maier, PLLC

(57) ABSTRACT
A method for processing an audio signal, an electronic apparatus, and a computer-readable recording medium that records a program, the method, the electronic apparatus, and the program enabling appropriately-engineered sound to be listened to on various devices. After model information about a model of a device to which an audio signal is supplied has been acquired, from among a plurality of sound-setting information items associated with this model information, one of the sound-setting information items, the one corresponding to a type of sound, the type having been specified in accordance with an instruction to be input, is selected. Then, an audio signal is processed in accordance with this selected one of the sound-setting information items, and the processed audio signal is supplied to the device.

11 Claims, 9 Drawing Sheets

(51) Int. Cl.
    *G10H 1/46*           (2006.01)
    *H03G 5/00*           (2006.01)
    *H04R 3/04*           (2006.01)

(58) Field of Classification Search
    USPC ........................................... 381/103, 98, 62
    See application file for complete search history.

(56)                 References Cited

OTHER PUBLICATIONS

Examination Report and Notification of Intention to Grant under Section 18(4) issued on Feb. 13, 2025, in corresponding British Application No. GB2412737.5, 2 pages.
International Search Report issued on Apr. 25, 2023 in corresponding application No. PCT/JP2023/005053; 4 Pages.

* cited by examiner

FIG.2A

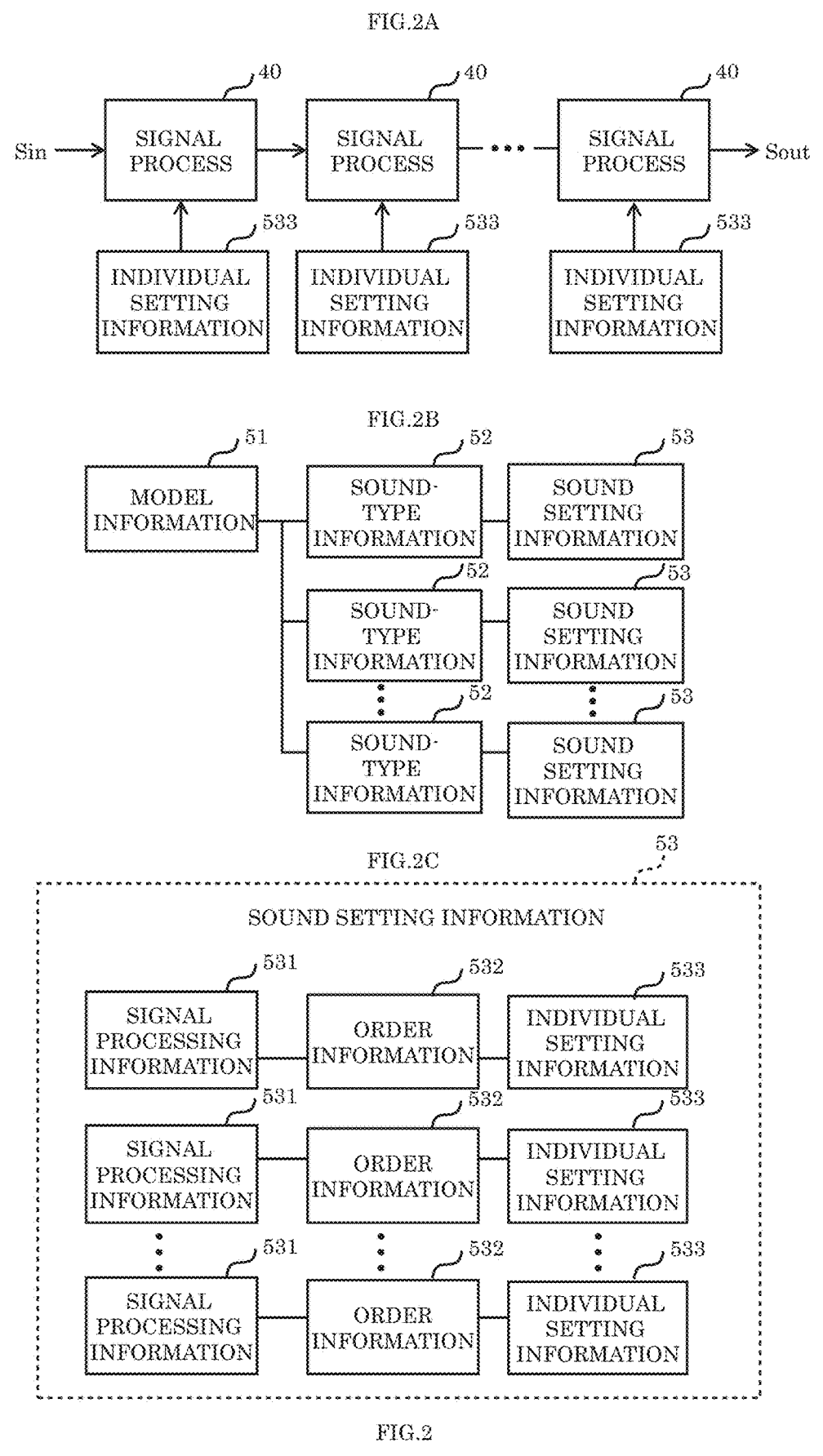

```
Sin →  ┌─────────┐      ┌─────────┐           ┌─────────┐
       │ SIGNAL  │  ⌒40 │ SIGNAL  │  ⌒40 ...  │ SIGNAL  │  ⌒40  → Sout
       │ PROCESS │ →    │ PROCESS │ →         │ PROCESS │
       └─────────┘      └─────────┘           └─────────┘
            ↑                ↑                     ↑
       ┌─────────┐  ⌒533 ┌─────────┐  ⌒533   ┌─────────┐  ⌒533
       │INDIVIDUAL│      │INDIVIDUAL│         │INDIVIDUAL│
       │ SETTING  │      │ SETTING  │         │ SETTING  │
       │INFORMATION│     │INFORMATION│        │INFORMATION│
       └─────────┘      └─────────┘           └─────────┘
```

FIG.2B

```
┌──────────┐ ⌒51    ┌──────────┐ ⌒52    ┌──────────┐ ⌒53
│  MODEL   │        │  SOUND-  │        │  SOUND   │
│INFORMATION│───┬───│  TYPE    │────────│ SETTING  │
└──────────┘   │    │INFORMATION│       │INFORMATION│
               │    └──────────┘        └──────────┘
               │    ┌──────────┐ ⌒52    ┌──────────┐ ⌒53
               │    │  SOUND-  │        │  SOUND   │
               ├────│  TYPE    │────────│ SETTING  │
               │    │INFORMATION│       │INFORMATION│
               │    └──────────┘        └──────────┘
               │         ⋮ ⌒52               ⋮ ⌒53
               │    ┌──────────┐        ┌──────────┐
               │    │  SOUND-  │        │  SOUND   │
               └────│  TYPE    │────────│ SETTING  │
                    │INFORMATION│       │INFORMATION│
                    └──────────┘        └──────────┘
```

FIG.2C

```
                                                      ⌒53
┌─ ─ ─ ─ ─ ─ ─ ─ ─ ─ ─ ─ ─ ─ ─ ─ ─ ─ ─ ─ ─ ─ ─ ─ ─ ─┐
│         SOUND SETTING INFORMATION                   │
│  ┌──────────┐ ⌒531  ┌──────────┐ ⌒532  ┌──────────┐ ⌒533│
│  │  SIGNAL  │       │          │       │INDIVIDUAL│  │
│  │PROCESSING│───────│  ORDER   │───────│ SETTING  │  │
│  │INFORMATION│      │INFORMATION│      │INFORMATION│ │
│  └──────────┘       └──────────┘       └──────────┘  │
│  ┌──────────┐ ⌒531  ┌──────────┐ ⌒532  ┌──────────┐ ⌒533│
│  │  SIGNAL  │       │          │       │INDIVIDUAL│  │
│  │PROCESSING│───────│  ORDER   │───────│ SETTING  │  │
│  │INFORMATION│      │INFORMATION│      │INFORMATION│ │
│  └──────────┘       └──────────┘       └──────────┘  │
│       ⋮ ⌒531             ⋮ ⌒532             ⋮ ⌒533   │
│  ┌──────────┐       ┌──────────┐       ┌──────────┐  │
│  │  SIGNAL  │       │          │       │INDIVIDUAL│  │
│  │PROCESSING│───────│  ORDER   │───────│ SETTING  │  │
│  │INFORMATION│      │INFORMATION│      │INFORMATION│ │
│  └──────────┘       └──────────┘       └──────────┘  │
└─ ─ ─ ─ ─ ─ ─ ─ ─ ─ ─ ─ ─ ─ ─ ─ ─ ─ ─ ─ ─ ─ ─ ─ ─ ─┘
```

FIG.2

METHOD FOR PROCESSING AUDIO SIGNAL TO BE SUPPLIED TO DEVICE, ELECTRONIC APPARATUS, AND COMPUTER-READABLE RECORDING MEDIUM

TECHNICAL FIELD

The present disclosure relates to a method for processing an audio signal to be supplied to a device such as headphones, an electronic apparatus, and a computer-readable recording medium.

BACKGROUND

A large number of software tools for sound engineering of music pieces on personal computers, smartphones, and the like have been released, which is enabling even amateurs to create their own favorite sound.

In addition, in recent years, subscription-based music distribution services have become widespread, which is enabling music to be easily listened to on various devices connected to networks.

SUMMARY

Incidentally, when the same digital audio signal is converted to sound via speakers of different devices (such as headphones), due to variations in frequency characteristics, use environments, and the like from device to device, the sound is perceived differently on each of the devices. Thus, there is a demand for listening to music and the like that have been appropriately adjusted in accordance with the devices. However, inherently, the sound engineering of the music pieces and the like requires a high level of knowledge and skill. Thus, even when the above-mentioned software tools are given, it is difficult for average users to create the sound as they want.

The technology disclosed herein present disclosure has been made in view of such circumstances, and an object thereof is to provide a method for processing an audio signal, the method enabling appropriately-engineered sound to be listened to on various devices, an electronic apparatus that executes such a method for processing an audio signal, and a computer-readable recording medium that records a program for causing the electronic apparatus to execute such a method for processing an audio signal.

According to a first aspect of the technology disclosed herein, there is provided a method for processing an audio signal to be supplied to a device, the device converting the audio signal to sound, an electronic apparatus that processes the audio signal storing a plurality of sound-setting information items that respectively specify content of processes on the audio signal, and a plurality of model-information items that respectively include information items about models of the device, the plurality of sound-setting information items corresponding respectively to different types of the sound, the plurality of model-information items each being associated with one or more sound-setting information items among the plurality of sound-setting information items, the one or more sound-setting information items corresponding to one or more types of the sound among the different types of the sound, the method including:

acquiring, by the electronic apparatus, the plurality of model-information items about the models of the device to which the audio signal that has been subjected to the processes is supplied;

selecting, by the electronic apparatus, one sound-setting information item from among the plurality of sound-setting information items associated with the acquired plurality of model-information items, the one sound-setting information item corresponding to one type among the different types of the sound, the one type having been specified in accordance with an instruction to be input; and processing, by the electronic apparatus, the audio signal in accordance with the selected one sound-setting information item.

According to a second aspect of the technology disclosed herein, there is provided an electronic apparatus that processes an audio signal to be supplied to a device, and includes:

a processing unit; and a storage unit that stores a program including a command which can be executed by the processing unit, the device converting the audio signal to sound, the electronic apparatus that processes the audio signal storing a plurality of sound-setting information items that respectively specify content of processes on the audio signal, and a plurality of model-information items that respectively include information items about models of the device, the plurality of sound-setting information items corresponding respectively to different types of the sound, the plurality of model-information items each being associated with one or more sound-setting information items among the plurality of sound-setting information items, the one or more sound-setting information items corresponding to one or more types of the sound among the different types of the sound, the program including the command to acquire the plurality of model-information items about the models of the device to which the audio signal that has been subjected to the processes is supplied, to select one sound-setting information item from among the plurality of sound-setting information items associated with the acquired plurality of model-information items, the one sound-setting information item corresponding to one type among the different types of the sound, the one type having been specified in accordance with an instruction to be input, and to process the audio signal in accordance with the selected one sound-setting information item.

According to a third aspect of the technology disclosed herein, there is provided an electronic apparatus that processes an audio signal to be supplied to a device, the device converting the audio signal to sound, the electronic apparatus that processes the audio signal storing a plurality of sound-setting information items that respectively specify content of processes on the audio signal, and a plurality of model-information items that respectively include information items about models of the device, the plurality of sound-setting information items corresponding respectively to different types of the sound, the plurality of model-information items each being associated with one or more sound-setting information items among the plurality of sound-setting information items, the one or more sound-setting information items corresponding to one or more types of the sound among the different types of the sound, the electronic apparatus including:

means for acquiring the plurality of model-information items about the models of the device to which the audio signal to be subjected to the processes is supplied;

means for selecting one sound-setting information item from among the plurality of sound-setting information items associated with the acquired plurality of model-information items, the one sound-setting information item corresponding to one type among the different types of the sound, the one type having been specified in accordance with an instruction to be input; and means for processing the audio signal in accordance with the selected one sound-setting information item.

According to a fourth aspect of an embodiment of the technology disclosed herein, there is provided a program including a command which can be executed by an electronic apparatus that processes an audio signal to be supplied to a device, the device converting the audio signal to sound, the electronic apparatus that processes the audio signal storing a plurality of sound-setting information items that respectively specify content of processes on the audio signal, and a plurality of model-information items that respectively include information items about models of the device, the plurality of sound-setting information items corresponding respectively to different types of the sound, the plurality of model-information items each being associated with one or more sound-setting information items among the plurality of sound-setting information items, the one or more sound-setting information items corresponding to one or more types of the sound among the different types of the sound, the program including the command to cause the electronic apparatus to acquire the plurality of model-information items about the models of the device to which the audio signal to be subjected to the processes is supplied, to select one sound-setting information item from among the plurality of sound-setting information items associated with the acquired plurality of model-information items, the one sound-setting information item corresponding to one type among the different types of the sound, the one type having been specified in accordance with an instruction to be input, and to process the audio signal in accordance with the selected one sound-setting information item.

According to a fifth aspect of the embodiment of the technology disclosed herein, there is provided a computer-readable recording medium that records the program according to the above-described fourth aspect.

Advantageous Effects of Invention

According to the technology disclosed herein, it is possible to provide the method for processing an audio signal, the method enabling appropriately-engineered sound to be listened to on various devices, the electronic apparatus that executes such a method for processing an audio signal, and the computer-readable recording medium that records the program for causing the electronic apparatus to execute such a method for processing an audio signal.

BRIEF DESCRIPTION OF DRAWINGS

FIG. 2A is an explanatory diagram of a signal process to be executed on an audio signal. FIG. 2B and FIG. 2C are explanatory diagrams of information items to be stored in a storage unit of the electronic apparatus.

DETAILED DESCRIPTION OF EMBODIMENTS

First Embodiment

A first embodiment according to a technology of the present disclosure is described with reference to the drawings.

Figure 1:
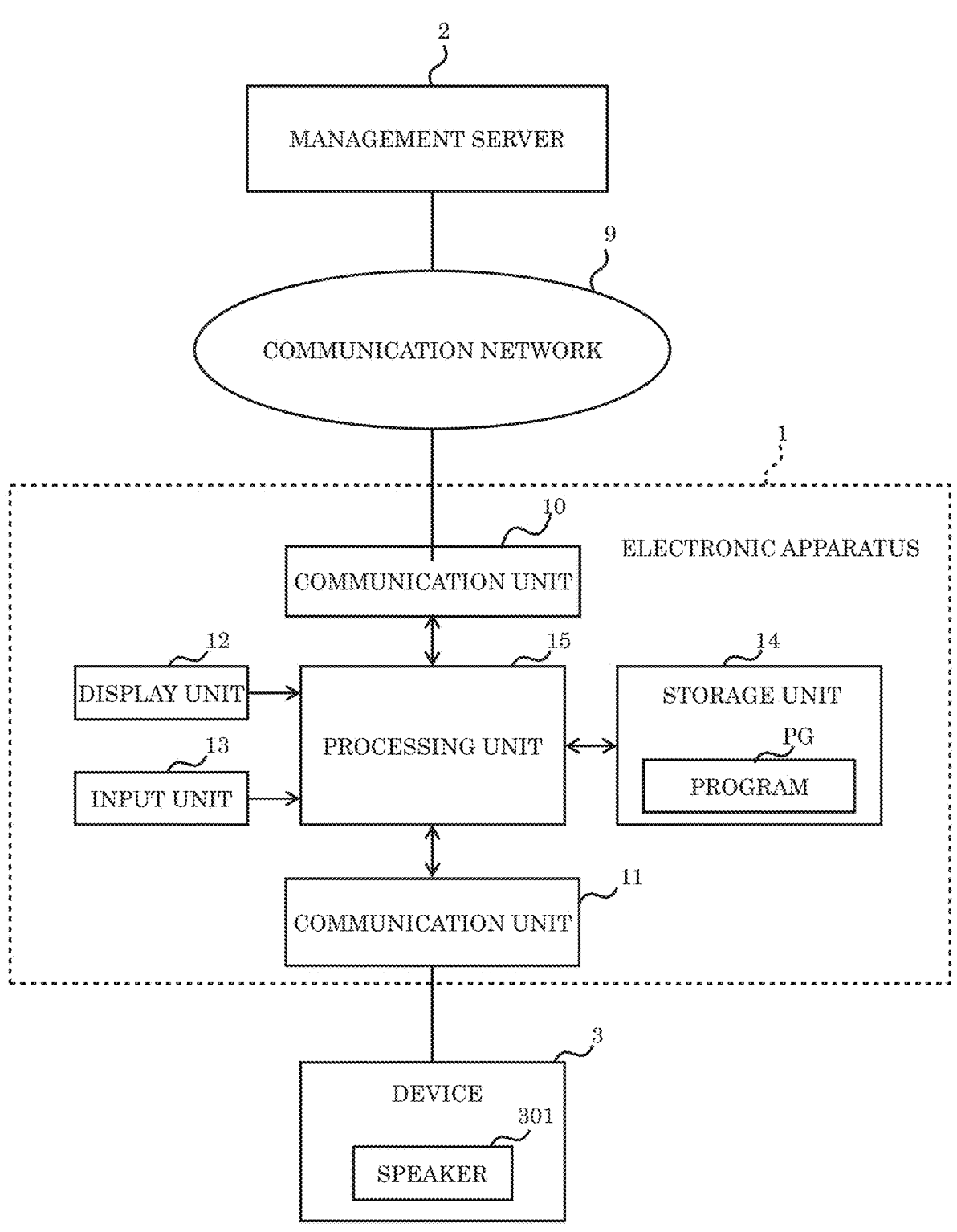
FIG. 1 is a diagram showing an example of a configuration of a system including an electronic apparatus according to an embodiment of the present disclosure.

FIG. 1 is a diagram showing an example of a configuration of a system including an electronic apparatus 1 according to this embodiment. The system shown in FIG. 1 includes a device 3 that converts an audio signal to sound, the electronic apparatus 1 that processes the audio signal to be supplied to the device 3, and a management server 2.

As shown in FIG. 1, the device 3 includes one or more speakers 301 that convert the audio signal to the sound. The device 3 accepts, from the electronic apparatus 1, the audio signal that has been subjected to an audio-signal process described below, and causes the speaker 301 to convert the audio signal to the sound. The device 3 may be connected in a wired manner to the electronic apparatus 1 so as to accept the audio signal, or may accept the audio signal from the electronic apparatus 1 via wireless communication using Bluetooth (trademark), a wireless LAN, or the like. Examples of the device 3 include headphones, earphones, a wired or a wireless speaker, a smart speaker equipped with artificial intelligence, an audio device such as a car audio device, and a television having a network connection function or a communication function.

The management server 2 is a server that manages users of the electronic apparatus 1, and is communicable with the management server 2 via a communication network 9 such as the Internet. The management server 2 is capable of making access to a database that registers the users of the electronic apparatus 1, and executes a process of verifying that the users of the electronic apparatus 1 are the users registered with the database at a time when the electronic apparatus 1 executes the audio-signal process. For example, a manager of the management server 2 may charge service fees to the users of the electronic apparatus 1 according, for example, to a subscription-based business model. In that case, the management server 2 may perform a process for managing payments of the service fees between the management server 2 and each of the users.

The electronic apparatus 1 executes, in accordance with a model of the device 3, the predetermined audio-signal process on the audio signal to be supplied to the device 3. For example, the electronic apparatus 1 reproduces the audio signal from a music file that is provided by streaming from a music distribution server via the communication network 9, or from a music file that has already been stored, executes the predetermined audio-signal process on the reproduced audio signal, and then supplies this audio signal to the device 3. The electronic apparatus 1 may be, but not limited in particular to, an information device having a communication function, such as a smartphone, a tablet, a mobile phone, a notebook PC, or a desktop PC. Alternatively, the electronic apparatus 1 may be a dongle that is connected to the above-mentioned information device via a USB (universal serial bus) port or other ports, or may be a module component that is incorporated into the information device.

As shown in FIG. 1, the electronic apparatus 1 includes communication units 10 and 11, a display unit 12, an input unit 13, a storage unit 14, and a processing unit 15.

The communication unit 10 is a device for communicating with other apparatuses (such as the management server 2) via the communication network 9, and includes a communication device (such as network interface card) that performs communication according to a predetermined communication standard (such as that of wireless LAN or Ethernet (trademark)).

The communication unit 11 is a device that communicates with the device 3 for transmitting, to the device 3, the audio signal that has been subjected to the audio-signal process, and includes a communication device that performs communication according to a predetermined communication standard. When the device 3 has a short-range wireless communication function using Bluetooth (trademark) or the like, the communication unit 11 may include a communication module that provides the short-range wireless communication function.

Note that, when the device 3 is configured to accept analog audio signals, the electronic apparatus 1 may include, instead of the above-described communication unit 11, an electronic circuit that converts digital audio signals to the analog audio signals and outputs these analog audio signals (such as A/D converter, a filter circuit, or an audio amplifier).

The input unit 13 allows instructions in response to operations by the users and other information to be input to the processing unit 15. The input unit 13 includes an at least one device having an input function, such as a touchscreen, a touchpad, a keyboard, a mouse, buttons, switches, a microphone, or a camera.

The display unit 12 is a device that displays a video based on a video signal to be generated by the processing unit 15, and includes a display device such as a liquid-crystal display, an OLED display, or a projector.

The storage unit 14 stores, for example, commands of a program PG that is executed by the processing unit 15, data that is temporarily stored in a procedure of processes by the processing unit 15, data that is utilized in the processes by the processing unit 15, and data obtained as a result of the processes by the processing unit 15. The storage unit 14 may include main storage devices (such as a ROM and a RAM) and auxiliary storage devices (such as a flash memory, an SSD, a hard disk, a memory card, and an optical disk). The storage unit 14 may be constituted by a single storage device, or may be constituted by a plurality of storage devices. When the storage unit 14 is constituted by the plurality of storage devices, these storage devices are connected to the processing unit 15 via a computer bus or other arbitrary information-transmission means.

The program PG may be a program that is recorded in a computer-readable recording medium (such as a USB flash drive, a memory card, an optical disk, or other non-transitory tangible media), that is input from a reading device (not shown), and that is stored into the storage unit 14, or may be a program that is received from the other apparatuses via the communication unit 11, and that is stored into storage unit 14.

The processing unit 15 comprehensively controls overall operation of the electronic apparatus 1, and executes predetermined information processes. The processing unit 15 includes one or more processors (such as a CPU (central processing unit), an MPU (micro-processing unit), and a DSP (digital signal processor)) that execute the processes in accordance with the commands of the one or more programs PG stored in the storage unit 14. The one or more processors execute the commands of the programs PG stored in the storage unit 14. With this, the processing unit 15 operates as a computer.

The processing unit 35 may include one or more dedicated hardware modules (such as an ASIC (application specific integrated circuit) and an FPGA (field-programmable gate array)) configured to implement specific functions. In this case, the processing unit 15 may execute, as the computer, all the processes described in this embodiment, or may execute at least some of the processes by using the dedicated hardware modules.

FIG. 2A is an explanatory diagram of the signal process to be executed on the audio signal by the electronic apparatus 1. For example, as shown in FIG. 2A, the electronic apparatus 1 executes, in a stepwise manner, one or more signal processes 40 on an audio signal Sin to be processed, the audio signal Sin having been acquired from the music file or the like. With this, the electronic apparatus 1 generates an audio signal Sout to be supplied to the device 3. For example, the electronic apparatus 1 executes, on the audio signal Sin, the one or more signal processes 40 that have been selected in accordance with sound setting information 53 described below from among the plurality of signal processes 40 for respectively executing different processes on the audio signal. At a time of individually executing the signal processes 40, the electronic apparatus 1 processes the audio signal in accordance with individual setting information 533 that is given to each of the signal processes 40.

The electronic apparatus 1 may include an arbitrary software module (such as plug-in), or may include dedicated hardware (audio-signal processing circuit) as means for individually executing the signal processes 40.

The plurality of signal processes 40 that are selectable in the electronic apparatus 1 may include, but not limited in particular to audio-signal processes of various types (such as an equalizer type, a transient-processing type, or a compressor type), the audio-signal processes being generally used in the field of sound engineering (also called effects).

For example, the equalizer-type signal process 40 is a process of adjusting volume of the audio signal in one or a plurality of frequency bands. The electronic apparatus 1 may be allowed to select, as the equalizer-type signal process 40, a plurality of types of signal processes 40 that are different from each other in the frequency band in which the volume is adjusted. For example, the electronic apparatus 1 may be allowed to independently select an equalizer-type signal process 40 for bass and equalizer-type signal processes 40 for midrange, mid-high range, and treble. The equalizer-type signal process 40 for bass adjusts massiveness of low-end sounds such as those of bass and a kick drum. The equalizer-type signal processes 40 for midrange, mid-high range, and treble adjust atmosphere, realism, and brilliance of music pieces.

The individual setting information 533 to be given in the equalizer-type signal process 40 includes numerical values (in decibels, percentages, and the like) for adjusting the volume in the one or more frequency bands.

The transient-processing-type signal process 40 is a process of improving crispness of sound of rhythm instruments (such as drums) by adjusting volume in a specific frequency band.

The individual setting information 533 to be given in the transient-processing-type signal process 40 includes numerical values (in decibels, percentages, and the like) for adjusting volume in the specific frequency band.

The compressor-type signal process 40 is a process of controlling unity and a stereo image of a music piece by adjusting a dynamic range of the sound, for example, through suppression of peaks of a waveform of the sound and through adjustment of gain of an entirety of the waveform.

The individual setting information 533 to be given in the compressor-type signal process 40 includes a threshold (for example, in decibels) at which compression (volume compression) starts, a compression ratio (compression rate of volume above the threshold), an attack time (for example, in milliseconds) at which the compression starts, a release time (for example, in milliseconds) at which the compression ends, gain (in decibels) of level adjustment to be performed after the compression, and information that specifies whether processes by a compressor are executed in a stereo mode or an M/S mode.

FIG. 2B is an explanatory diagram of information items to be stored in the storage unit 14 of the electronic apparatus 1 (model information 51, sound-type information 52, and the sound setting information 53).

The model information 51 includes information about models of the device 3 (such as identification codes assigned to individual models, names of the models, and names of vendors that manufacture or sell the device 3). One model-information item 51 corresponds to one model. The storage unit 14 stores a plurality of model-information items 51 corresponding to a plurality of models.

The sound-type information 52 is information that indicates a type of sound. One sound-type information item 52 corresponds to one type of the sound. The storage unit 14 stores a plurality of sound-type information items 52 corresponding to a plurality of types of the sound.

As an example, the sound-type information 52 may include information that indicates a type of the sound which is expressed by the audio signal Sin to be processed. Specifically, the sound-type information 52 may include information that indicates a genre of music (such as pop, rock, classical, vocal, jazz, reggae, hip-hop, blues, or film music), and information that indicates a type of a sound source (such as a type of a musical instrument).

In addition, the sound-type information 52 may include information that indicates a type of the sound which is expressed by the audio signal Sout after the processes. For example, in a case where the sound which is expressed by the audio signal Sout after the processes is sound that is suited to be listened to in a specific situation or a specific environment, the sound-type information 52 may include information that indicates the specific situation or the specific environment. Examples of the specific situation include a situation where the sound is listened to during conversation and a situation where the sound is listened to during exercise. Examples of the specific environment include inside a subway, inside a store, a quiet place, and a noisy place.

The sound setting information 53 is information that specifies content of processes on the audio signal (such as the audio-signal process by which the audio signal Sin is converted to the audio signal Sout as shown in FIG. 2A). The storage unit 14 stores a plurality of sound-setting information items 53. The plurality of sound-setting information items 53 correspond respectively to the different types of the sound. In other words, the plurality of sound-setting information items 53 are associated respectively with the different sound-type information items 52.

As shown in FIG. 2B, the plurality of model-information items 51 to be stored in the storage unit 14 are each associated with the one or more sound-setting information items 53 corresponding to the one or more types of the sound. In other words, the one or the plurality of sound-type information items 52 are associated with the one model-information item 51, and the one sound-setting information item 53 is associated with each of the one or the plurality of sound-type information items 52.

The one sound-setting information item 53 associated with the one model-information item 51 and the one sound-type information item 52 indicates the content of the audio-signal process to be executed in a case where sound of a type indicated by the one sound-type information item 52 is output by the device 3 of a model indicated by the one model-information item 51. The sound-setting information items 53 are each an information item that is prepared to cause the device 3 to output appropriate sound in a combination of one model and one type of sound. The sound setting information 53 may be, for example, created by a professional sound engineer.

FIG. 2C is an explanatory diagram of information items that are included in the sound setting information 53 (signal processing information 531, order information 532, and the individual setting information 533).

The sound setting information 53 includes information that specifies one or more signal processes to be used in the process on the audio signal, information that specifies an order of execution of these signal processes on the audio signal, and the signal processing information 531 to be used in each of the signal processes. For example, as shown in FIG. 2C, the sound setting information 53 includes one or more signal-processing information items 531, one or more order information items 532, and the one or more individual-setting information items 533.

The individual-setting information items 533 are each associated with a corresponding one of the signal-processing information items 531 and a corresponding one of the order information items 532.

The one signal-processing information item 531 is an information item that indicates a corresponding one of the signal processes 40, and includes an identification code assigned to the corresponding one of the signal processes 40.

The one order information item 532 is an information item that specifies an order in which a corresponding one of the signal processes 40, the corresponding one being indicated by an associated one of the signal-processing information items 531, is executed in the audio-signal process, specifically, includes an information item that indicates in which order the corresponding one of the signal processes 40 is executed from the first.

The sound-setting information items 53 each including these information items (signal processing information 531, order information 532, and individual setting information 533) specify the signal processes 40 to be used in the audio-signal process, their order of execution, and the individual-setting information items 533 to be used respectively in the signal processes 40.

Figure 3:
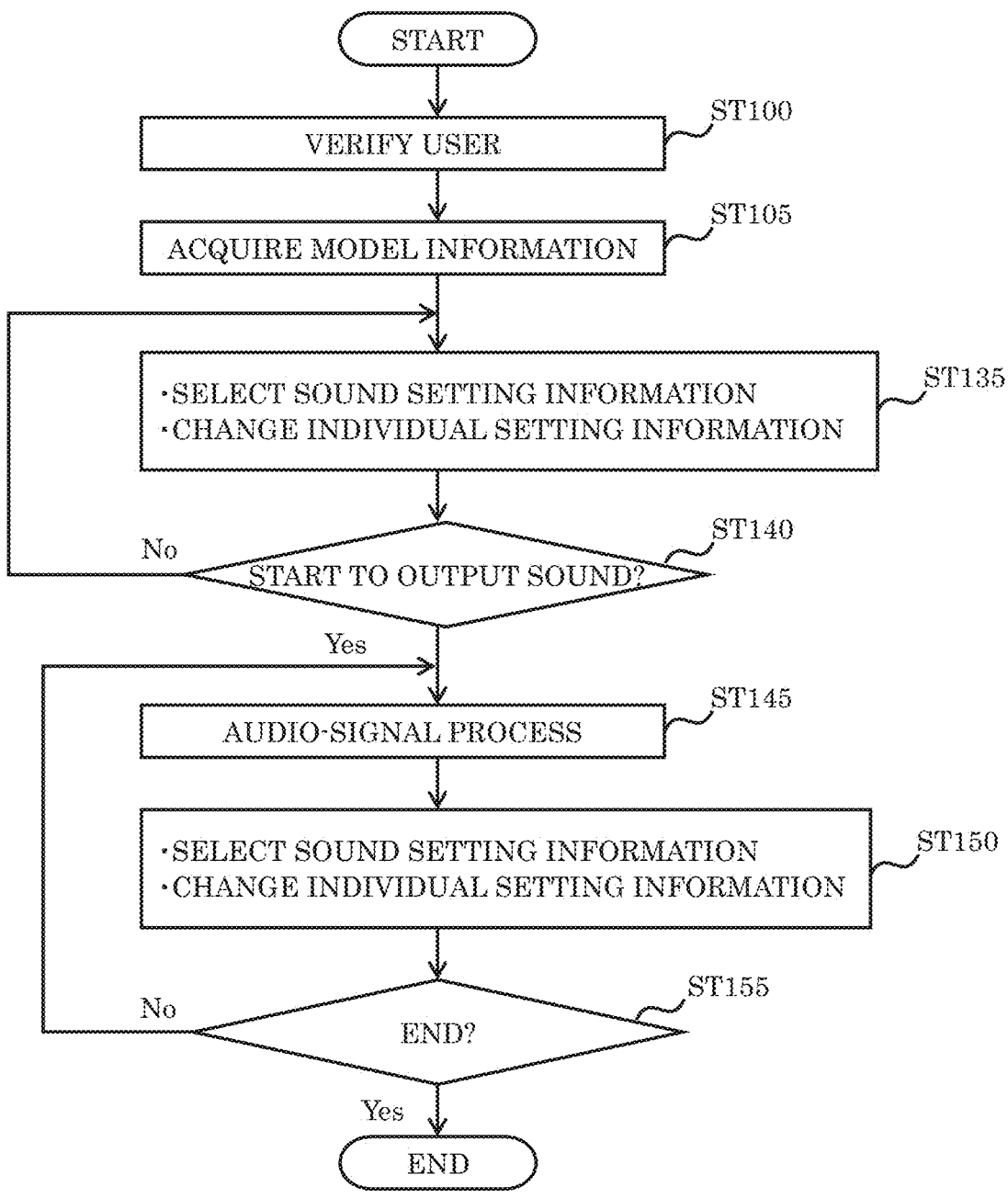
FIG. 3 is an explanatory flowchart of an operation of the electronic apparatus according to a first embodiment.

Below, the operation of the electronic apparatus 1 configured as described above according to this embodiment is described with reference to flowcharts of FIG. 3 and FIG. 4.

The processing unit 15 of the electronic apparatus 1 communicates with the management server 2 via the communication unit 11, and transmits verification information (such as an ID and a password) of a user who uses the electronic apparatus 1 to the management server 2 (ST100). After the management server 2 has verified, on the basis of this verification information, that the user who uses the electronic apparatus 1 is an authorized user, the processing unit 15 of the electronic apparatus 1 executes processes of Step ST105 and subsequent Steps described below.

The processing unit 15 of the electronic apparatus 1 acquires the model information 51 about the model of the device 3 to which the audio signal Sout that has been subjected to the processes is supplied (ST105). For example, the processing unit 15 may acquire the model information 51 that the user has input via, for example, a screen A (FIG. 5) described below. Alternatively, the processing unit 15 may automatically acquire the model information 51 on the basis of information received from the device 3 via the communication with the device 5 having the communication function using Bluetooth (trademark) or the like. The automatic acquisition of the model information 51 from the device 3 saves time and effort for the user.

In addition, in response to the instruction to be input to the input unit 13 by the user, the processing unit 15 of the electronic apparatus 1 executes a process of selecting the sound setting information 53, and a process of changing the individual setting information 533 (ST135).

Figure 4:
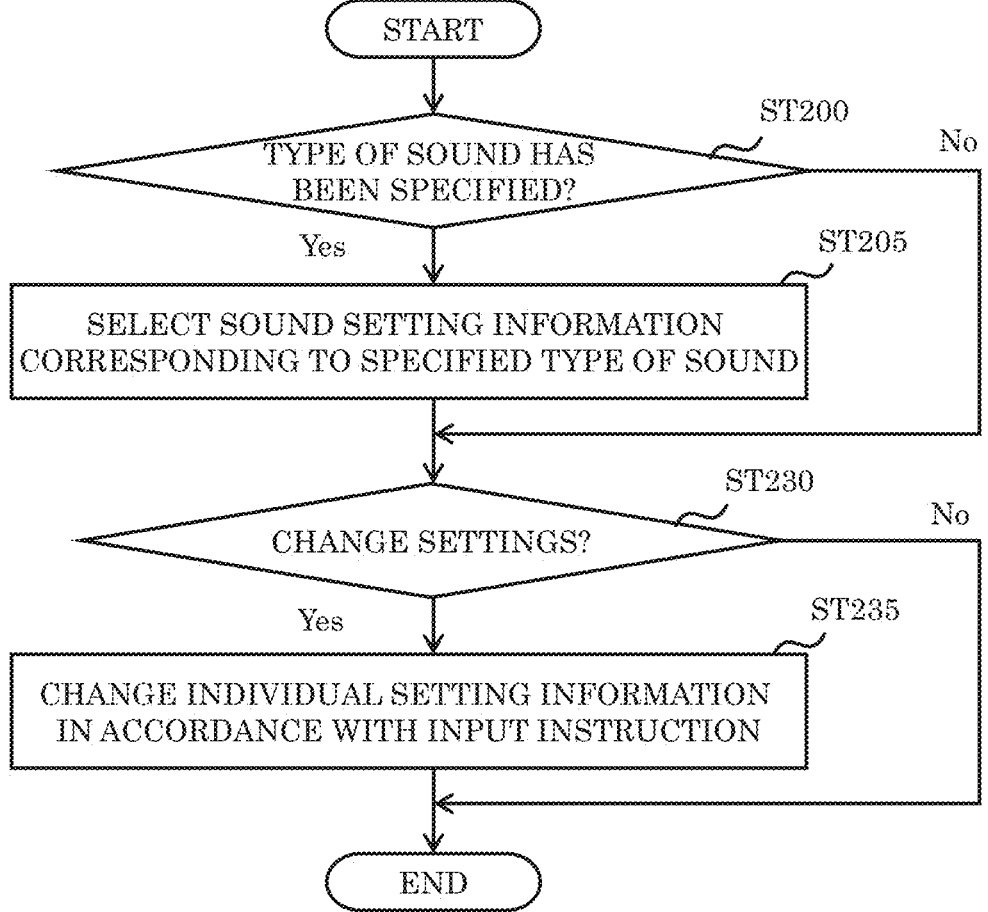
FIG. 4 is an explanatory flowchart of processes of selecting sound setting information and changing individual setting information in the electronic apparatus according to the first embodiment.

FIG. 4 is an explanatory flowchart of the processes of selecting the sound setting information 53 and changing the individual setting information 533 (ST135).

If an instruction to specify the type of the sound that the device 3 is caused to output is input by the user (Yes in ST200), the processing unit 15 of the electronic apparatus 1 selects the sound setting information 53 corresponding to the specified type of the sound (ST205). The sound setting information 53 selected in this way is used as the information that specifies the processing content of the audio-signal process described below (ST145 in FIG. 3).

In addition, if an instruction to change the individual setting information 533 to be used in a specific one of the signal processes 40 is input by the user (Yes in ST230), the processing unit 15 changes the individual setting information 533 in accordance with the input instruction (ST235). The individual setting information 533 changed in this way is used instead of the individual setting information 533 that is included in the sound setting information 53 in the audio-signal process described below (ST145 in FIG. 3).

Figure 5:
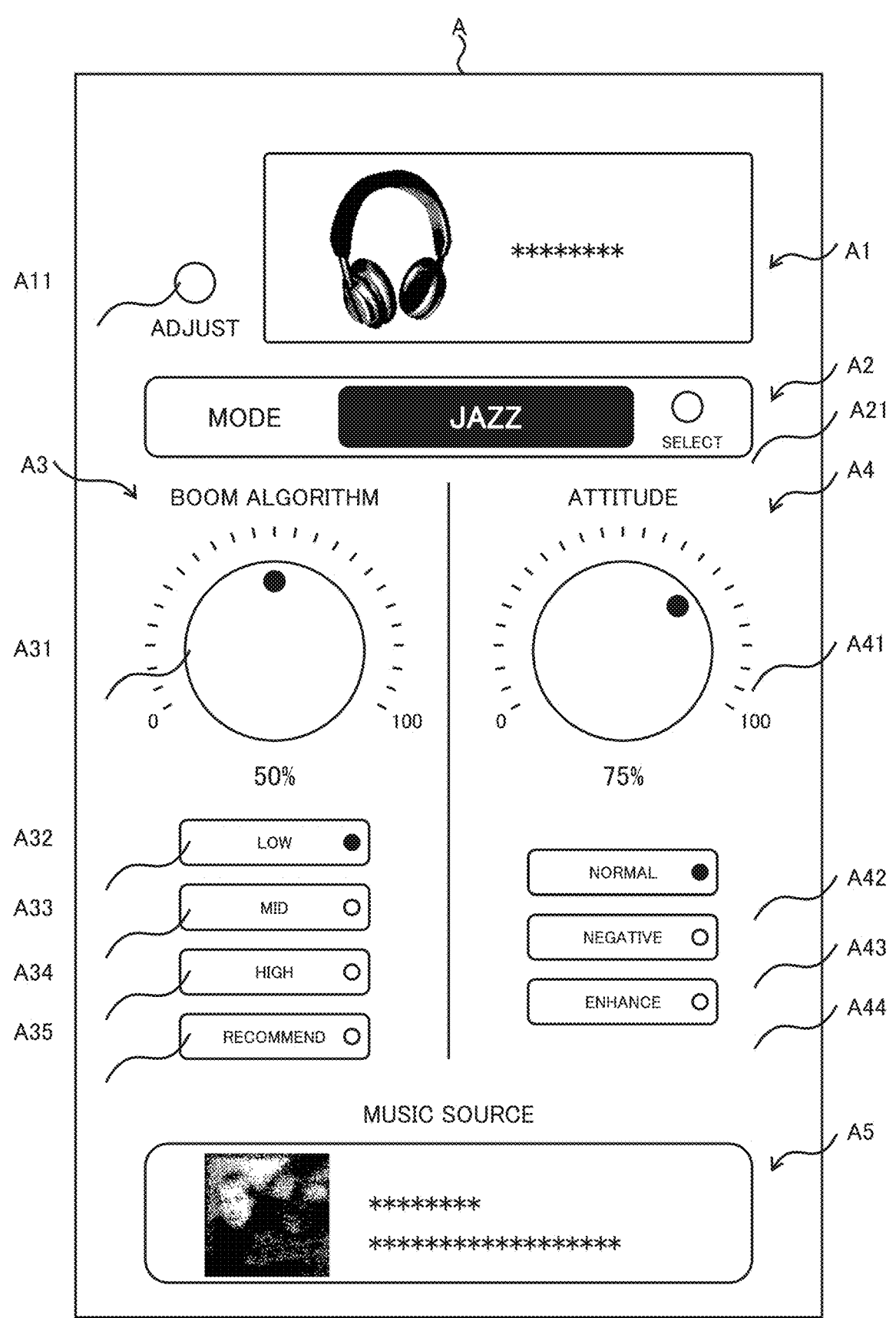
FIG. 5 is an exemplary image of a screen to which instructions by a user are input.

FIG. 5 is an exemplary image of a screen to be displayed on the display unit 12 of the electronic apparatus 1, specifically, an exemplary image of a screen for allowing the user to select the sound setting information 53 and to change the individual setting information 533.

The screen A shown in FIG. 5 includes an area A1 where the model of the device 3 (headphones in the example illustrated in FIG. 3) to which the audio signal Sout that has been subjected to the audio-signal process is supplied is displayed, an area A2 where the type of the sound (a music genre in the example illustrated in FIG. 3), the type having been selected by the user, is displayed, areas A3 and A4 where user-interface elements for changing the individual setting information 533 for the specific one of the signal processes 40 are arranged, and an area A5 where information about a sound source of the audio signal Sin to be processed (information about a track in the example illustrated in FIG. 3) is displayed.

A button A11 that is arranged next to the area A1 is operated by the user to specify the model of the device 3.

A button A21 that is arranged in the area A2 is operated by the user to select the type of the sound. Although one of the music genres (JAZZ) is selected in the example illustrated in FIG. 3, not only the music genres, but also other attributes of the sound may also be selectable in accordance with the instruction by the user. For example, a type of the sound source about the audio signal Sin to be processed (such as a musical instrument, a voice, or an environmental sound) may be selectable. Alternatively, types of the sound, the types being suited to listening in predetermined situations such as during conversation and during exercise, may be selectable, or types of the sound, the types being suited to listening in predetermined environments such as inside a subway and in a crowd may be selectable. The processing unit 15 of the electronic apparatus 1 uses the sound setting information 53 corresponding to the type of the sound, the type being selected in this way, in the audio-signal process described below (ST145 in FIG. 3).

In the area A3, user interface elements (A31 to A35) for changing settings of the equalizer-type signal process 40 for bass are arranged.

The buttons A32 to A34 are operated to exclusively select one of three frequency bands that span a bass range of a music piece. The rotary knob A31 is operated to adjust volume in a frequency band selected by operating the buttons A32 to A34. The button A35 is operated to reset volume in the three frequency bands to their respective predetermined-recommended levels (volume that has been set on the basis of the individual setting information 533 included in the sound setting information 53).

In response to adjustment of volume in the bass range by the operation of the buttons A32 to A35 and the rotary knob A31 in the area A3, the processing unit 15 of the electronic apparatus 1 generates individual setting information 533 by changing original individual-setting information 533 (individual setting information 533 included in the sound setting information 53) in accordance with the volume adjustment. If the processing unit 15 executes the equalizer-type signal process 40 for bass in the audio-signal process described below (ST145 in FIG. 3), the processing unit 15 processes the audio signal in accordance with the changed individual-setting information 533.

By adding bass energy through the adjustment of the volume in the bass range in the equalizer-type signal process 40 for bass, deep bass sounds that are otherwise inaudible with original settings become audible. This enables a powerful sound experience.

In the area A4, user interface elements (A41 to A44) for changing settings of the equalizer-type signal processes 40 for midrange, mid-high range, and treble are arranged.

The buttons A43 and A44 are operated to alternatively select properties of the sound to be adjusted by operating the rotary knob A41. If "NEGATIVE" corresponding to the button A43 has been selected, by operating the rotary knob A41, a degree of calming an atmosphere of the sound is adjusted. If "ENHANCE" corresponding to the button A44 has been selected, by operating the rotary knob A41, degrees of brilliance and clarity of the sound are adjusted. The button A42 is operated to reset the above-mentioned settings "NEGATIVE" and "ENHANCE" to their respective prede-termined-recommended levels (the volume that has been set on the basis of the individual setting information 533 included in the sound setting information 53).

In response to the adjustment of the properties of the sound (degree of calming the atmosphere of the sound, and degrees of brilliance and clarity of the sound) by the operation of the buttons A42 to A44 and the rotary knob A41 in the area A4, the processing unit 15 of the electronic apparatus 1 generates individual setting information 533 by changing the original individual-setting information 533 (individual setting information 533 included in the sound setting information 53) in accordance with the adjustment. If the processing unit 15 executes the equalizer-type signal processes 40 for midrange, mid-high range, and treble in the audio-signal process described below (ST145 in FIG. 3), the processing unit 15 processes the audio signal in accordance with the changed individual-setting information 533.

By adjusting the properties of the sound in the equalizer-type signal processes 40 for midrange, mid-high range, and treble, the atmosphere of the sound can be adjusted in accordance with a preference of the user.

FIG. 3 is referred to once again.

If an instruction to cause the device 3 to output the sound is input by the user (Yes in ST140), the processing unit 15 of the electronic apparatus 1 proceeds from Step ST135 to Step ST145. In Step ST145, the processing unit 15 executes the audio-signal process (FIG. 2A) on the audio signal Sin to be processed. For example, the processing unit 15 repro-duces the audio signal Sin to be processed from the music file that is provided by streaming from the music distribution server, or from the music file that has already been stored in the storage unit 14, and then executes the audio-signal process on the audio signal Sin.

In this case, on the basis of the sound setting information 53 (FIG. 2C) selected in Step ST135, the processing unit 15 of the electronic apparatus 1 not only sets the one or more signal processes 40 that constitute the audio-signal process and the order of the execution of the processes, but also sets the individual setting information items 533 to be used respectively in the signal processes 40. Note that, the processing unit 15 executes the specific one of the signal processes 40 on the audio signal by using the individual setting information 533 that has been changed in accordance with the instruction by the user in Step ST135.

In addition, also in a term when the audio-signal process of Step ST145 is executed (No in ST155), as in Step ST135, the processing unit 15 of the electronic apparatus 1 executes the processes in response to the instruction to be input to the input unit 13 by the user (selecting the sound setting information 53 and changing the individual setting informa-tion 533) (ST150). The processes of Step ST150 are executed as in the flowchart shown in FIG. 4. Thus, if the type of the sound is changed while the sound is being output from the device 3 (for example, if the button A21 illustrated in FIG. 5 is operated), the processing unit 15 executes the audio-signal process of Step ST145 on the basis of the sound setting information 53 corresponding to the changed type of the sound. In addition, if the individual setting information 533 for the specific one of the signal processes 40 is changed while the sound is being output from the device 3 (for example, if the rotary knob A31 or A41 illustrated in FIG. 5 is operated), the processing unit 15 processes the audio signal in accordance with the changed individual-setting information 533 in the specific one of the signal processes 40.

As described above, according to this embodiment, after the model information 51 about the model of the device 3 to which the audio signal Sout is supplied has been acquired (ST105), from among the plurality of sound-setting infor-mation items 53 associated with this model information 51, one of the sound-setting information items 53, the one corresponding to a type of the sound, the type having been specified in accordance with an instruction to be input, is selected (ST135). Then, the audio signal Sin is processed in accordance with this selected one of the sound-setting information items 53 (ST145), and the processed audio signal Sout is supplied to the device 3. In this way, the sound-setting information items 53 for achieving sound engineering that is difficult for amateurs to achieve can be prepared in accordance respectively with models of the device 3 and types of the sound, and can be used in the audio-signal process. Thus, the sound that has been appro-priately engineered in accordance with the types of the sound can be listened to on the devices 3 of various models.

In addition, according to this embodiment, if the indi-vidual setting information 533 to be used in a specific one of the signal processes 40 is changed in accordance with the instruction to be input (ST235), in the specific one of the signal processes 40, the audio signal is processed in accor-dance with the changed individual-setting information 533 (ST145). In this way, on the basis of the individual setting information 533 included in the prepared sound-setting information 53, the individual setting information 533 that has been changed in accordance with a preference of the user can be generated, and the audio-signal process can be executed with use of the changed individual-setting infor-mation 533. Thus, the sound to be output from the device 3 can be adjusted to better match the preference of the user.

Second Embodiment

Next, a second embodiment that relates to the technology disclosed herein is described.

The electronic apparatus 1 according to the second embodiment has a configuration similar to that of the electronic apparatus 1 (FIG. 1) according to the foregoing first embodiment. The electronic apparatus 1 according to the second embodiment is different from the electronic apparatus 1 according to the first embodiment in performing an operation to automatically select preset sound-setting information 53.

Figure 6:
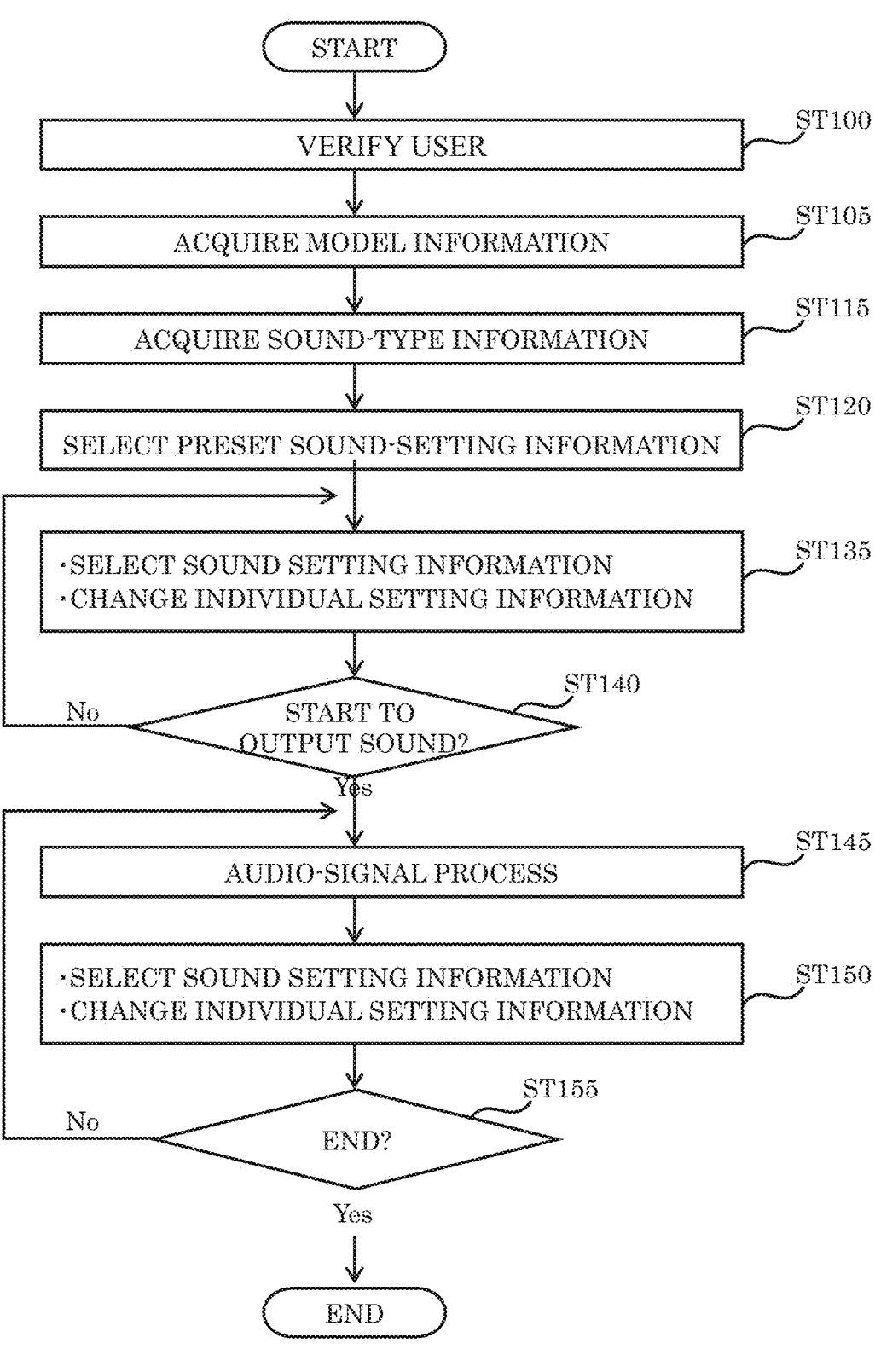
FIG. 6 is an explanatory flowchart of an operation of an electronic apparatus according to a second embodiment.

FIG. 6 is an explanatory flowchart of the operation of the electronic apparatus 1 according to the second embodiment. The flowchart shown in FIG. 6 is different from the flow-chart shown in FIG. 3 in further including Steps ST115 and ST120. Other Steps in the flowchart shown in FIG. 6 are the same as those in the flowchart shown in FIG. 3. Below, the added Steps ST115 and ST120 are described, and descrip-tion of the other Steps is omitted.

In Step ST115 before executing the audio-signal process (ST145), the processing unit 15 of the electronic apparatus 1 acquires the sound-type information 52 that indicates the type of the sound which is expressed by the audio signal Sin to be processed. For example, when the processing unit 15 reproduces the audio signal Sin to be processed from the music file that is provided by streaming from the music distribution server, the processing unit 15 may acquire the sound-type information 52 on the basis of information about a track to be provided in association with this music file from the music distribution server. Alternatively, when the processing unit 15 reproduces the audio signal Sin to be processed from the music file that has been stored in the storage unit 14, the processing unit 15 may acquire the sound-type information 52 on the basis of information about a track that is included in this music file, or on the basis of information about the track, the information being stored in a manner that accompanies the music file in the storage unit 14.

Still alternatively, the processing unit 15 of the electronic apparatus 1 may determine the type of the sound directly from the audio signal Sin to be processed, and acquire the sound-type information 52 on the basis of a result of the determination.

For example, the processing unit 15 executes a process of analyzing features of the sound which is expressed by the audio signal Sin to be processed. Specifically, the processing unit 15 may analyze one or more features (quantified features) of the sound, the features being objects in various sound-analysis techniques, such as a feature that relates to a frequency spectrum of the sound, a feature that relates to a rhythm in the sound, a feature that relates to a speed of change in a waveform, and a feature that relates to chords in the sound.

Next, on the basis of the one or more analyzed features of the sound, the processing unit 15 distinguishes the types of the sound which is expressed by the audio signal Sin to be processed. For example, by applying the one or more features of the sound to a learned model that has been generated to distinguish the types of the sound on the basis of the one or more features of the sound, the processing unit 15 distinguishes the types of the sound which is expressed by the audio signal Sin to be processed, the one or more features of the sound having been obtained by the above-described analysis process. This learned model may be generated by using known arbitrary machine-learning algorithms such as neural networks, support vector machines, logistic regression, linear regression, decision trees, random forests, and gradient boosting.

After the processing unit 15 of the electronic apparatus 1 has acquired the sound-type information 52 in Step ST115, the processing unit 15 selects one sound-setting information item 53 as the "preset sound-setting information 53" from among the plurality of sound-setting information items 53 that have been associated with the model information 51 acquired in Step ST105, the one sound-setting information item 53 corresponding to the type of the sound, the type being indicated by the acquired sound-type information 52 (ST120).

The processing unit 15 of the electronic apparatus 1 sets the "preset sound-setting information 53" automatically selected in Step ST120 as initial sound-setting information 53 before the instruction by the user is input in Step ST135. In accordance with the instruction by the user, the instruction being input in Step ST135, the processing unit 15 changes the "preset sound-setting information 53" to other sound-setting information 53, or resets the other sound-setting information 53 to the "preset sound-setting information 53."

As described above, according to this embodiment, the sound-type information 52 that indicates the type of the sound which is expressed by the audio signal Sin to be processed is automatically acquired, and then the "preset sound-setting information 53" corresponding to a type of the sound, the type being indicated by the sound-type information 52, is automatically selected. This allows the user not to manually select the type of the sound which is expressed by the audio signal Sin to be processed, and hence time and effort of the user can be reduced. In addition, if the automatically-selected type of the sound is unsuited, the type of the sound can also be reselected in accordance with the instruction by the user. Thus, the number of instances where the audio-signal process (ST145) is executed on the basis of the unsuited sound-setting information 53 can be reduced.

Note that, the automatically-selected "preset sound-setting information 53" need not necessarily be arbitrarily changeable in accordance with the instruction by the user as described above in the example of this embodiment. As another example of this embodiment, the automatically-selected original "preset sound-setting information 53" may be used in the audio-signal process (ST145). With this, the type of the sound which is expressed by the audio signal Sin to be processed can be automatically selected, and hence time and effort of the user can be reduced.

Third Embodiment

Next, a third embodiment that relates to the technology disclosed herein is described. The electronic apparatus 1 according to the third embodiment has a configuration similar to that of the electronic apparatus 1 (FIG. 1) according to the foregoing first embodiment. The electronic apparatus 1 according to the third embodiment is different from the electronic apparatus 1 according to the second embodiment in performing an operation to store content of changes of the individual setting information 533 in accordance with the instruction by the user, and to reuse the stored content of the changes.

Figure 7:
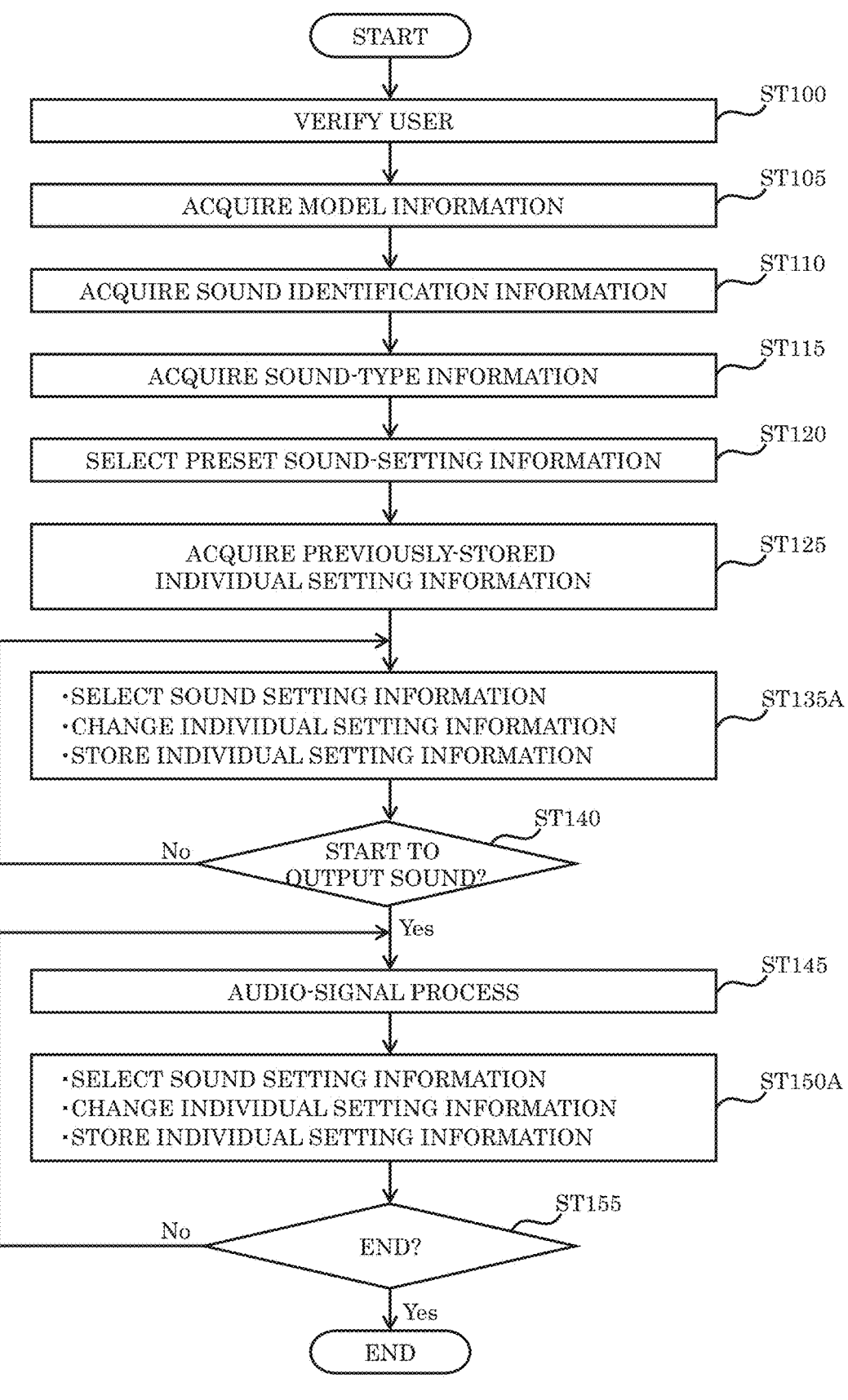
FIG. 7 is an explanatory flowchart of an operation of an electronic apparatus according to a third embodiment.

FIG. 7 is an explanatory flowchart of the operation of the electronic apparatus 1 according to the third embodiment. The flowchart shown in FIG. 7 is different from the flowchart shown in FIG. 6 in further including Steps ST110 and ST125, and in including Steps ST135A and ST150A instead of Steps ST135 and ST150. Other Steps in the flowchart shown in FIG. 7 are the same as those in the flowchart shown in FIG. 6. Below, Steps that are different from those in the flowchart of FIG. 6 (ST110, ST125, ST135A, and ST150A) are described, and description of the other Steps is omitted.

In Step ST110 before executing the audio-signal process (ST145), the processing unit 15 of the electronic apparatus 1 acquires sound identification information 54 for identifying the audio signal Sin to be processed. For example, when the processing unit 15 reproduces the audio signal Sin to be processed from the music file that is provided by streaming from the music distribution server, the processing unit 15 may acquire the sound identification information 54 on the basis of an identification code of a sound source (such as International Standard Recording Code) of a track to be provided in association with this music file from the music distribution server or another server. Alternatively, when the processing unit 15 reproduces the audio signal Sin to be processed from the music file that has been stored in the storage unit 14, the processing unit 15 may acquire the sound-type information 52 on the basis of an identification code of a sound source of a track which is stored in a manner that accompanies the music file in the storage unit 14.

Still alternatively, the processing unit 15 of the electronic apparatus 1 may acquire, on the basis of the one or more features (quantified features) of the sound which is expressed by the audio signal Sin to be processed, the unique sound-type information 52 about the audio signal Sin to be processed, the one or more features of the sound having been obtained by an analysis method similar to that in the description of Step ST115.

After the processing unit 15 of the electronic apparatus 1 has acquired the sound identification information 54 in Step ST110, the processing unit 15 executes, in Steps ST135A and ST150A of executing processes in accordance with the instruction by the user, processes of associating this sound identification information 54 and the changed individual-setting information 533 with each other and storing these information items.

Figure 8:
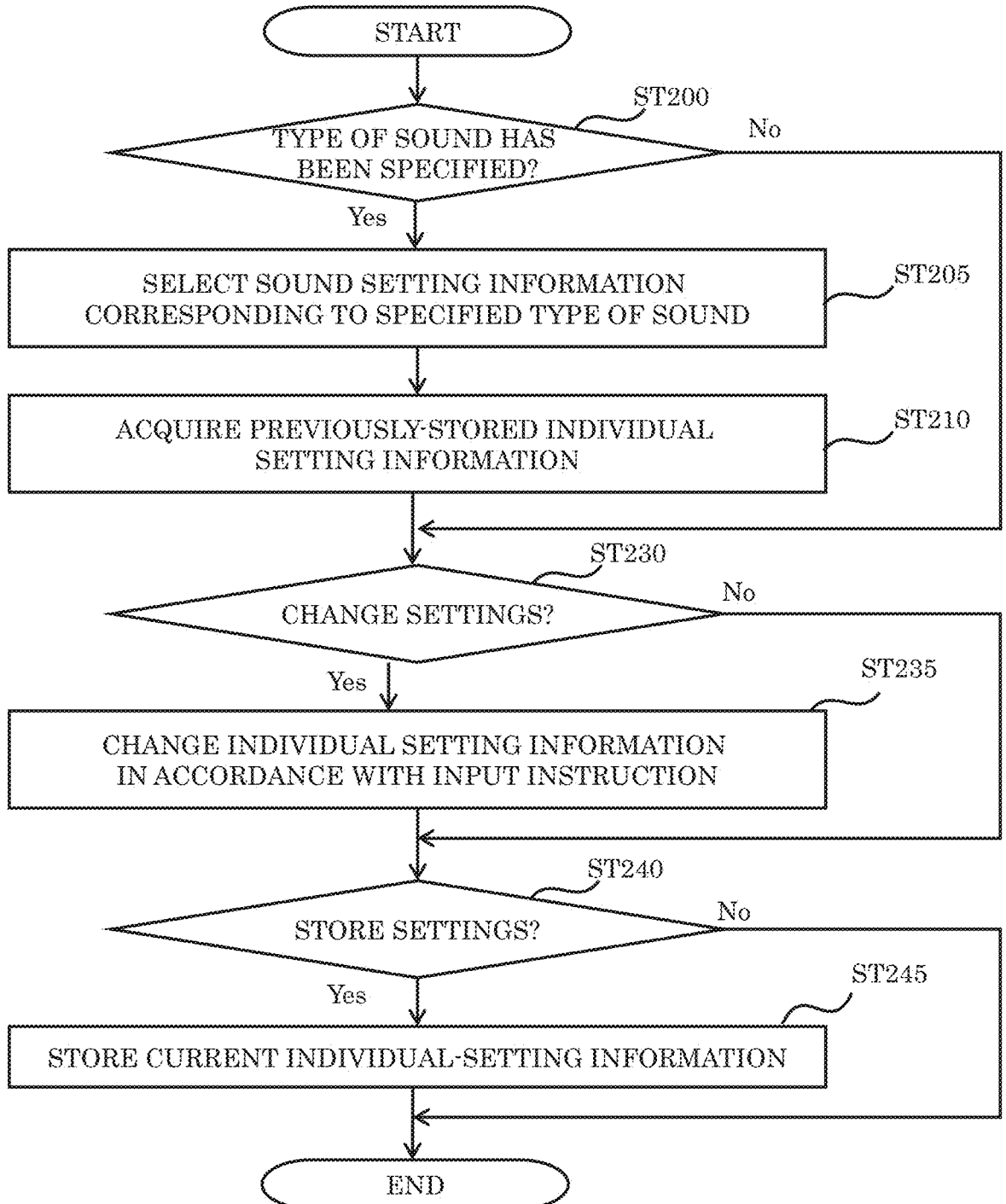
FIG. 8 is an explanatory flowchart of processes of selecting the sound setting information, and changing and storing the individual setting information in the electronic apparatus according to the third embodiment.

FIG. 8 is an explanatory flowchart showing processes of selecting the sound setting information 53, changing the individual setting information 533, and storing the individual setting information 533 in the electronic apparatus 1 according to the third embodiment, that is, showing a detailed example of the processes of Steps ST135A and ST150A (FIG. 7). The flowchart shown in FIG. 8 is different from the flowchart shown in FIG. 4 in further including Steps ST210, ST240, and ST245, and other Steps are the same as those in the flowchart shown in FIG. 4.

If an instruction to request to store the individual setting information 533 changed in Step ST235 is input by the user (Yes in ST240), the processing unit 15 of the electronic apparatus 1 causes the individual setting information 533 changed in Step ST235 to be stored into the storage unit 14 (ST245) in association with the model information 51 acquired in Step ST105 (FIG. 7), the sound setting information 53 selected in Step ST120 (FIG. 7) or Step ST205 (FIG. 8), and the sound identification information 54 acquired in Step ST110.

Figure 9:
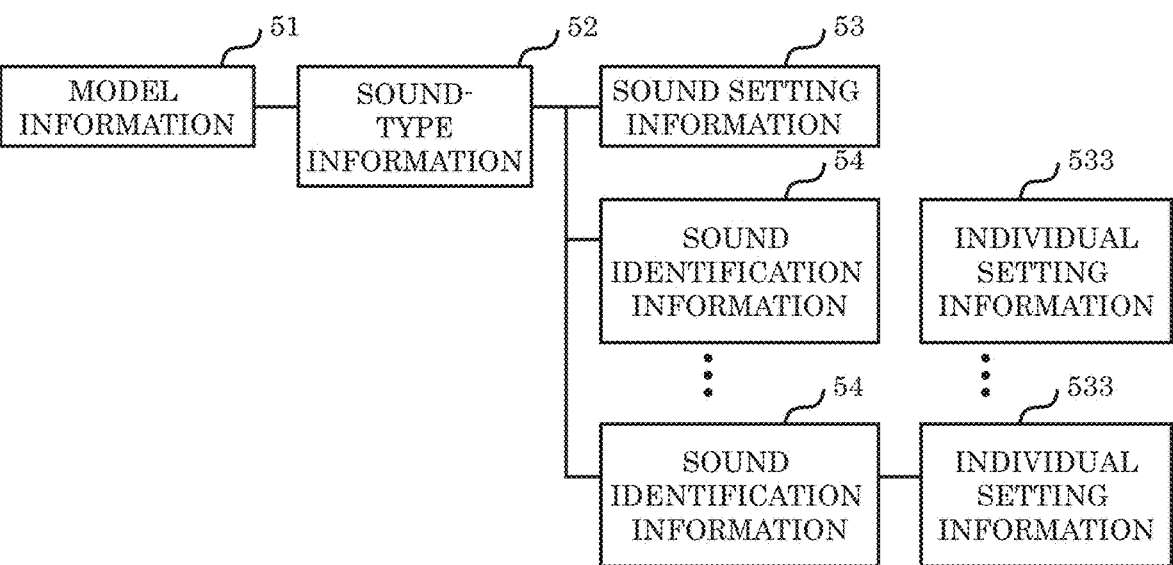
FIG. 9 is an explanatory diagram of information items to be stored in the storage unit of the electronic apparatus.

FIG. 9 is an explanatory diagram of the changed individual-setting information 533 to be stored in the storage unit 14. As in an example shown in FIG. 9, one changed individual-setting information item 533 is stored in the storage unit 14 in association with one model-information item 51, one sound-setting information item 53, and one sound-identification information item 54. Thus, if the one model-information item 51, the one sound-type information item 52 (one sound-setting information item 53), and the one sound-identification information item 54 are given, the one changed individual-setting information item 533 associated with these information items can be read out of the storage unit 14.

In Step ST125 in FIG. 7 and Step ST270 in FIG. 8, the processing unit 15 of the electronic apparatus 1 executes a process of reading the changed individual-setting information 533 stored in previous Step ST245 out of the storage unit 14.

Specifically, the processing unit 15 reads the changed individual-setting information 533 out of the storage unit 14 (ST125: FIG. 7), the changed individual-setting information 533 having been associated with the model information 51 acquired in Step ST105, the sound-type information 52 acquired in Step ST115 (sound setting information 53 selected in Step ST120), and the sound identification information 54 acquired in Step ST110. The processing unit 15 sets this individual setting information 533 read in Step ST125 as initial individual-setting information 533 before the instruction by the user is input in Step ST135A. With this, changes of the previously-stored individual setting information 533 are reflected in status of initial settings in the area A3 and the area A4 on the screen A (FIG. 5).

In addition, if the processing unit 15 selects the sound setting information 53 that is different from previous ones (ST205) by changing the type of the sound in Step ST200

(FIG. 8), the processing unit 15 reads the changed individual-setting information 533 out of the storage unit 14 (ST210: FIG. 8), the changed individual-setting information 533 having been associated with the model information 51 acquired in Step ST105, the sound-type information 52 specified in Step ST200 (sound setting information 53 selected in Step ST210), and the sound identification information 54 acquired in Step ST110. In the audio-signal process of Step ST145, the processing unit 15 uses this individual setting information 533 read in Step ST210 instead of the original individual-setting information 533 included in the sound setting information 53.

As described above, according to this embodiment, the individual setting information 533 that has been changed in accordance with the instruction to be input by the user is stored in the storage unit 14 in association with the sound identification information 54 for identifying each of the audio signals Sin, the model information 51, and the sound setting information 53 (ST245). In addition, in the process on the audio signal Sin (ST145), the changed individual-setting information 533 stored in the storage unit 14 in association with the sound identification information 54, the model information 51, and the sound setting information 53 is used instead of the original individual-setting information 533 included in the sound setting information 53.

With this, in a case where the same audio signal Sin to be supplied to the devices 3 of the same model is processed again on the basis of the same sound-setting information 53, the audio-signal process can be executed with use of the previously-stored changed individual-setting information 533 instead of the original individual-setting information 533 included in the sound setting information 53. Thus, in a case of repeatedly listening to the same audio signal Sin under the same condition, it is no longer necessary to make similar changes to the individual setting information 533 (adjustment of sound) again and again. As a result, time and effort of the user can be reduced.

Note that, the present invention is not limited only to the embodiments described hereinabove, and may be embodied in various other forms.

For example, the electronic apparatus 1 need not necessarily be a smartphone, a personal computer, or the like as described above in the examples of the embodiments of the technology disclosed herein. The electronic apparatus 1 may be, for example, an electronic component that is incorporated in the device 3 (such as headphones). In this case, arbitrary terminal devices (such as a smartphone and a tablet) that perform wireless communication with the electronic apparatus 1 via, for example, a communication module compatible with Bluetooth (trademark) or the like may be used as means for inputting the instructions by the user to the electronic apparatus 1.

The process on the audio signal Sin (ST145) need not necessarily be executed by the processing unit 15 of the electronic apparatus 1 as described above in the examples of the embodiments of the technology disclosed herein. The process on the audio signal Sin (ST145) may be executed, for example, by using an audio-signal processing module including a processor (such as a DSP) or hardware (such as an FPGA) for the signal processes. More specifically, the processing unit 15 of the electronic apparatus 1 may cause the audio-signal processing module to execute the above-described process on the audio signal Sin (ST145) with the audio-signal processing module connected to the electronic apparatus 1 via an arbitrary interface (such as an USB) that performs communication in a wired or wireless manner.

Below, appendices relating to the technology disclosed herein are described.

[A1] An electronic apparatus that processes an audio signal to be supplied to a device, the device converting the audio signal to sound, the electronic apparatus that processes the audio signal storing a plurality of sound-setting information items that respectively specify content of processes on the audio signal, and a plurality of model-information items that respectively include information items about models of the device, the plurality of sound-setting information items corresponding respectively to different types of the sound, the plurality of model-information items each being associated with one or more sound-setting information items among the plurality of sound-setting information items, the one or more sound-setting information items corresponding to one or more types of the sound among the different types of the sound, the electronic apparatus including:

means for acquiring the plurality of model-information items about the models of the device to which the audio signal that has been subjected to the processes is supplied;

means for selecting one sound-setting information item from among the plurality of sound-setting information items associated with the acquired plurality of model-information items, the one sound-setting information item corresponding to one type among the different types of the sound, the one type having been specified in accordance with an instruction to be input; and means for processing the audio signal in accordance with the selected one sound-setting information item.

[A2] The electronic apparatus according to [A1], further including:

means for acquiring sound-type information items that indicate the different types of the sound which is expressed by the audio signal to be subjected to the processes; and means for selecting another one sound-setting information item as a preset sound-setting information item from among the plurality of sound-setting information items associated with the acquired plurality of model-information items, the other one sound-setting information item corresponding to another one type among the different types of the sound, the other one type being indicated by one sound-type information item among the acquired sound-type information items, in which the means for selecting the one sound-setting information item selects, in accordance with the instruction to be input, the one sound-setting information item that is the same as or different from the preset sound-setting information.

[A3] An electronic apparatus that processes an audio signal to be supplied to a device, the device converting the audio signal to sound, the electronic apparatus that processes the audio signal storing a plurality of sound-setting information items that respectively specify content of processes on the audio signal, and a plurality of model-information items that respectively include information items about models of the device, the plurality of sound-setting information items corresponding respectively to different types of the sound, the plurality of model-information items each being associated with one or more sound-setting information items among the plurality of sound-setting information items, the one or more sound-setting information items corresponding to one or more types of the sound among the different types of the sound, the electronic apparatus including:

means for acquiring the plurality of model-information items about the models of the device to which the audio signal that has been subjected to the processes is supplied;

means for acquiring sound-type information items that indicate the different types of the sound which is expressed by the audio signal to be subjected to the processes;

means for selecting one sound-setting information item from among the plurality of sound-setting information items associated with the acquired plurality of model-information items, the one sound-setting information item corresponding to one type among the different types of the sound, the one type being indicated by one sound-type information item among the acquired sound-type information items; and means for processing the audio signal in accordance with the selected one sound-setting information item.

[A4] The electronic apparatus according to [A2] or [A3], in which the means for acquiring the sound-type information items analyzes features of the sound which is expressed by the audio signal to be subjected to the processes, and distinguishes the different types of the sound which is expressed by the audio signal to be subjected to the processes by applying the analyzed features of the sound to a learned model that has been generated to distinguish the different types of the sound on the basis of the analyzed features of the sound.

[A5] The electronic apparatus according to any one of [A1] to [A4], in which the means for processing the audio signal executes, in a stepwise manner on the audio signal to be subjected to the processes, one or more signal processes that have been selected from among a plurality of signal processes for executing different processes on the audio signal, in which the one or more signal processes include processing the audio signal in accordance respectively with given individual-setting information items, and in which the plurality of sound-setting information items each include information that specifies the one or more signal processes, information that specifies an order of execution of the one or more signal processes on the audio signal, and the given individual-setting information items to be used respectively in the one or more signal processes.

[A6] The electronic apparatus according to [A5], further including means for changing a given at least one individual-setting information item among the given individual-setting information items in accordance with the instruction to be input, the given at least one individual-setting information item being used in an at least one signal process among the one or more signal processes, in which, in response to the changing of the given at least one individual-setting information item to be used in the at least one signal process, the means for processing the audio signal processes the audio signal in accordance with the changed at least one individual-setting information item in the at least one signal process.

[A7] The electronic apparatus according to [A6], further including:

means for acquiring a sound-identification information item for identifying the audio signal to be subjected to the processes; and means for causing the changed at least one individual-setting information item to be stored in association with the acquired sound-identification information item, an acquired corresponding one model-information item among the acquired plurality of model-information items, and the selected one sound-setting information item, the changed at least one individual-setting information item having been changed in accordance with the instruction to be input, in which, in a case where the changed at least one individual-setting information item has been stored in association with the acquired sound-identification information item, the acquired corresponding one model-information item, and the selected one sound-setting information item, the means for processing the audio signal processes the audio signal with use of the stored changed at least one individual-setting information item instead of the given individual-setting information items included in the selected one sound-setting information item.

[A8] The electronic apparatus according to any one of [A1] to [A7], in which the means for acquiring the plurality of model-information items acquires the plurality of model-information items on the basis of information received from the device via communication with the device.

[A9] The electronic apparatus according to any one of [A1] to [A8], in which the means for processing the audio signal causes an audio-signal processing module connected to the electronic apparatus to process the audio signal.

[B1] An electronic apparatus that processes an audio signal to be supplied to a device, and includes:

a processing unit; and a storage unit that stores a program including a command which can be executed by the processing unit, the device converting the audio signal to sound, the storage unit storing a plurality of sound-setting information items that respectively specify content of processes on the audio signal, and a plurality of model-information items that respectively include information items about models of the device, the plurality of sound-setting information items corresponding respectively to different types of the sound, the plurality of model-information items each being associated with one or more sound-setting information items among the plurality of sound-setting information items, the one or more sound-setting information items corresponding to one or more types of the sound among the different types of the sound, the processing unit performing, in accordance with the command of the program, acquiring the plurality of model-information items about the models of the device to which the audio signal that has been subjected to the processes is supplied, selecting one sound-setting information item from among the plurality of sound-setting information items associated with the acquired plurality of model-information items, the one sound-setting information item corresponding to one type among the different types of the sound, the one type having been specified in accordance with an instruction to be input, and processing the audio signal in accordance with the selected one sound-setting information item.

[B2] The electronic apparatus according to [B1], in which the processing unit performs, in accordance with the command of the program, acquiring sound-type information items that indicate the different types of the sound which is expressed by the audio signal to be subjected to the processes, and selecting another one sound-setting information item as a preset sound-setting information item from among the plurality of sound-setting information items associated with the acquired plurality of model-information items, the other one sound-setting information item corresponding to another one type among the different types of the sound, the other one type being indicated by one sound-type information item among the acquired sound-type information items, and in which the selecting of the one sound-setting information items by the processing unit includes selecting, in accordance with the instruction to be input, the one sound-setting information item that is the same as or different from the preset sound-setting information.

[B3] An electronic apparatus that processes an audio signal to be supplied to a device, and includes:

a processing unit; and a storage unit that stores a program including a command which can be executed by the processing unit, the device converting the audio signal to sound, the storage unit storing a plurality of sound-setting information items that respectively specify content of processes on the audio signal, and a plurality of model-information items that respectively include information items about models of the device, the plurality of sound-setting information items corresponding respectively to different types of the sound, the plurality of model-information items each being associated with one or more sound-setting information items among the plurality of sound-setting information items, the one or more sound-setting information items corresponding to one or more types of the sound among the different types of the sound, the processing unit performing, in accordance with the command of the program, acquiring the plurality of model-information items about the models of the device to which the audio signal that has been subjected to the processes is supplied, acquiring sound-type information items that indicate the different types of the sound which is expressed by the audio signal to be subjected to the processes, selecting one sound-setting information item from among the plurality of sound-setting information items associated with the acquired plurality of model-information items, the one sound-setting information item corresponding to one type among the different types of the sound, the one type being indicated by one sound-type information item among the acquired sound-type information items, and processing the audio signal in accordance with the selected one sound-setting information item.

[B4] The electronic apparatus according to [B2] or [B3], in which the acquiring of the sound-type information items by the processing unit includes analyzing features of the sound which is expressed by the audio signal to be subjected to the processes, and distinguishing the different types of the sound which is expressed by the audio signal to be subjected to the processes by applying the analyzed features of the sound to a learned model that has been generated to distinguish the different types of the sound on the basis of the analyzed features of the sound.

[B5] The electronic apparatus according to any one of [B1] to [B4], in which the processing of the audio signal by the processing unit includes executing, in a stepwise manner on the audio signal to be subjected to the processes, one or more signal processes that have been selected from among a plurality of signal processes for executing different processes on the audio signal, in which the one or more signal processes include processing the audio signal in accordance respectively with given individual-setting information items, and in which the plurality of sound-setting information items each include information that specifies the one or more signal processes, information that specifies an order of execution of the one or more signal processes on the audio signal, and the given individual-setting information items to be used respectively in the one or more signal processes.

[B6] The electronic apparatus according to [B5], in which the processing unit performs, in accordance with the command of the program, changing a given at least one individual-setting information item among the given individual-setting information items in accordance with the instruction to be input, the given at least one individual-setting information item being used in an at least one signal process among the one or more signal processes, and in which the processing of the audio signal by the processing unit includes processing, in response to the changing of the given at least one individual-setting information item to be used in the at least one signal process, the audio signal in accordance with the changed at least one individual-setting information item in the at least one signal process.

[B7] The electronic apparatus according to [B6], in which the processing unit performs, in accordance with the command of the program, acquiring a sound-identification information item for identifying the audio signal to be subjected to the processes; and causing the changed at least one individual-setting information item to be stored in association with the acquired sound-identification information item, an acquired corresponding one model-information item among the acquired plurality of model-information items, and the selected one sound-setting information item, the changed at least one individual-setting information item having been changed in accordance with the instruction to be input, in which the processing of the audio signal by the processing unit includes processing, in a case where the changed at least one individual-setting information item has been stored in association with the acquired sound-identification information item, the acquired corresponding one model-information item, and the selected one sound-setting information item, the audio signal with use of the stored changed at least one individual-setting information item instead of the given individual-setting information items included in the selected one sound-setting information item.

[B8] The electronic apparatus according to any one of [B1] to [B7], in which the acquiring of the plurality of model-information items by the processing unit includes acquiring the plurality of model-information items on the basis of information received from the device via communication with the device.

[B9] The electronic apparatus according to any one of [B1] to [B8], in which the processing of the audio signal by the processing unit includes causing an audio-signal processing module connected to the electronic apparatus to process the audio signal.

The invention claimed is:

1. A method for processing an audio signal to be supplied to a device, the device converting the audio signal to sound, an electronic apparatus that processes the audio signal storing: a plurality of sound-setting information items that respectively specify content of processes on the audio signal, and a plurality of model-information items that respectively include information items about models of the device, the plurality of sound-setting information items corresponding respectively to different types of the sound, the plurality of model-information items each being associated with one or more sound-setting information items among the plurality of sound-setting information items, the one or more sound-setting information items corresponding to one or more types of the sound among the different types of the sound, and the method comprising:

acquiring, by the electronic apparatus, the plurality of model-information items about the models of the device to which the audio signal that has been subjected to the processes is supplied;

selecting, by the electronic apparatus, one sound-setting information item from among the plurality of sound-setting information items associated with the acquired plurality of model-information items, the one sound-setting information item corresponding to one type among the different types of the sound, the one type having been specified in accordance with an instruction to be input;

processing, by the electronic apparatus, the audio signal in accordance with the selected one sound-setting information item;

acquiring, by the electronic apparatus, sound-type information items that indicate the different types of the sound which is expressed by the audio signal to be subjected to the processes; and selecting, by the electronic apparatus, another one sound-setting information item as a preset sound-setting information item from among the plurality of sound-setting information items associated with the acquired plurality of model-information items, the other one sound-setting information item corresponding to another one type among the different types of the sound, the other one type being indicated by one sound-type information item among the acquired sound-type information items, wherein the selecting of the one sound-setting information item by the electronic apparatus includes selecting, in accordance with the instruction to be input, the one sound-setting information item that is same as or different from the preset sound-setting information, and the acquiring of the sound-type information items by the electronic apparatus includes:

analyzing features of the sound which is expressed by the audio signal to be subjected to the processes, and distinguishing the different types of the sound which is expressed by the audio signal to be subjected to the processes by applying the analyzed features of the sound to a learned model that has been generated to distinguish the different types of the sound on a basis of the analyzed features of the sound.

2. A method for processing an audio signal to be supplied to a device, the device converting the audio signal to sound, an electronic apparatus that processes the audio signal storing: a plurality of sound-setting information items that respectively specify content of processes on the audio signal, and a plurality of model-information items that respectively include information items about models of the device, the plurality of sound-setting information items corresponding respectively to different types of the sound, the plurality of model-information items each being associated with one or more sound-setting information items among the plurality of sound-setting information items, the one or more sound-setting information items corresponding to one or more types of the sound among the different types of the sound, and the method comprising:

acquiring, by the electronic apparatus, the plurality of model-information items about the models of the device to which the audio signal that has been subjected to the processes is supplied;

acquiring, by the electronic apparatus, sound-type information items that indicate the different types of the sound which is expressed by the audio signal to be subjected to the processes;

selecting, by the electronic apparatus, one sound-setting information item from among the plurality of sound-setting information items associated with the acquired plurality of model-information items, the one sound-setting information item corresponding to one type among the different types of the sound, the one type being indicated by one sound-type information item among the acquired sound-type information items; and processing, by the electronic apparatus, the audio signal in accordance with the selected one sound-setting information item, wherein acquiring of the sound-type information items by the electronic apparatus includes:

analyzing features of the sound which is expressed by the audio signal to be subjected to the processes, and distinguishing the different types of the sound which is expressed by the audio signal to be subjected to the processes by applying the analyzed features of the sound to a learned model that has been generated to distinguish the different types of the sound on a basis of the analyzed features of the sound.

3. The method for processing the audio signal to be supplied to the device according to claim 2, wherein processing of the audio signal by the electronic apparatus includes executing, in a stepwise manner on the audio signal to be subjected to the processes, one or more signal processes that have been selected from among a plurality of signal processes for executing different processes on the audio signal, wherein the one or more signal processes include processing the audio signal in accordance respectively with given individual-setting information items, and wherein the plurality of sound-setting information items each include information that specifies the one or more signal processes, information that specifies an order of execution of the one or more signal processes on the audio signal, and the given individual-setting information items to be used respectively in the one or more signal processes.

4. The method for processing the audio signal to be supplied to the device according to claim 3, further comprising changing, by the electronic apparatus, a given at least one individual-setting information item among the given individual-setting information items in accordance with the instruction to be input, the given at least one individual-setting information item being used in an at least one signal process among the one or more signal processes, wherein processing of the audio signal by the electronic apparatus includes processing, in response to the changing of the given at least one individual-setting information item to be used in the at least one signal process, the audio signal in accordance with the changed at least one individual-setting information item in the at least one signal process.

5. The method for processing the audio signal to be supplied to the device according to claim 4, further comprising:

acquiring, by the electronic apparatus, a sound-identification information item for identifying the audio signal to be subjected to the processes; and causing, by the electronic apparatus, the changed at least one individual-setting information item to be stored in association with:

the acquired sound-identification information item, an acquired corresponding one model-information item among the acquired plurality of model-information items, and the selected one sound-setting information item, and the changed at least one individual-setting information item having been changed in accordance with the instruction to be input, wherein the processing of the audio signal by the electronic apparatus includes processing, in a case where the changed at least one individual-setting information item has been stored in association with the acquired sound-identification information item, the acquired corresponding one model-information item, and the selected one sound-setting information item, and the audio signal with use of the stored changed at least one individual-setting information item instead of the given individual-setting information items included in the selected one sound-setting information item.

6. A method for processing an audio signal to be supplied to a device, the device converting the audio signal to sound, an electronic apparatus that processes the audio signal storing a plurality of sound-setting information items that respectively specify content of processes on the audio signal, and a plurality of model-information items that respectively include information items about models of the device, the plurality of sound-setting information items corresponding respectively to different types of the sound, the plurality of model-information items each being associated with one or more sound-setting information items among the plurality of sound-setting information items, the one or more sound-setting information items corresponding to one or more types of the sound among the different types of the sound, and the method comprising:

acquiring, by the electronic apparatus, the plurality of model-information items about the models of the device to which the audio signal that has been subjected to the processes is supplied;

selecting, by the electronic apparatus, one sound-setting information item from among the plurality of sound-setting information items associated with the acquired plurality of model-information items, the one sound-setting information item corresponding to one type among the different types of the sound, the one type having been specified in accordance with an instruction to be input; and processing, by the electronic apparatus, the audio signal in accordance with the selected one sound-setting information item, wherein processing of the audio signal by the electronic apparatus includes executing, in a stepwise manner on the audio signal to be subjected to the processes, one or more signal processes that have been selected from among a plurality of signal processes for executing different processes on the audio signal, the one or more signal processes include processing the audio signal in accordance respectively with given individual-setting information items, the plurality of sound-setting information items each include:

information that specifies the one or more signal processes, information that specifies an order of execution of the one or more signal processes on the audio signal, and the given individual-setting information items to be used respectively in the one or more signal processes, the method further comprising:

changing, by the electronic apparatus, a given at least one individual-setting information item among the given individual-setting information items in accordance with the instruction to be input, the given at least one individual-setting information item being used in an at least one signal process among the one or more signal processes;

acquiring, by the electronic apparatus, a sound-identification information item for identifying the audio signal to be subjected to the processes; and causing, by the electronic apparatus, the changed at least one individual-setting information item to be stored in association with:

the acquired sound-identification information item, an acquired corresponding one model-information item among the acquired plurality of model-information items, and the selected one sound-setting information item, wherein the changed at least one individual-setting information item has been changed in accordance with the instruction to be input, the processing of the audio signal by the electronic apparatus includes:

processing, in response to the changing of the given at least one individual-setting information item to be used in the at least one signal process, the audio signal in accordance with the changed at least one individual-setting information item in the at least one signal process, and processing, in a case where the changed at least one individual-setting information item has been stored in association with:

the acquired sound-identification information item, the acquired corresponding one model-information item, and the selected one sound-setting information item, and the audio signal with use of the stored changed at least one individual-setting information item instead of the given individual-setting information items included in the selected one sound-setting information item.

7. The method for processing the audio signal to be supplied to the device according to claim 6, further comprising:

acquiring, by the electronic apparatus, sound-type information items that indicate the different types of the sound which is expressed by the audio signal to be subjected to the processes; and selecting, by the electronic apparatus, another one sound-setting information item as a preset sound-setting information item from among the plurality of sound-setting information items associated with the acquired plurality of model-information items, the other one sound-setting information item corresponding to another one type among the different types of the sound, the other one type being indicated by one sound-type information item among the acquired sound-type information items, and wherein selecting of the one sound-setting information items by the electronic apparatus includes selecting, in accordance with the instruction to be input, the one sound-setting information item that is same as or different from the preset sound-setting information.

8. A method for processing an audio signal to be supplied to a device, the device converting the audio signal to sound, an electronic apparatus that processes the audio signal storing: a plurality of sound-setting information items that respectively specify content of processes on the audio signal, and a plurality of model-information items that respectively include information items about models of the device, the plurality of sound-setting information items corresponding respectively to different types of the sound,

the plurality of model-information items each being associated with one or more sound-setting information items among the plurality of sound-setting information items, the one or more sound-setting information items corresponding to one or more types of the sound among the different types of the sound, and the method comprising:

acquiring, by the electronic apparatus, the plurality of model-information items about the models of the device to which the audio signal that has been subjected to the processes is supplied;

acquiring, by the electronic apparatus, sound-type information items that indicate the different types of the sound which is expressed by the audio signal to be subjected to the processes;

selecting, by the electronic apparatus, one sound-setting information item from among the plurality of sound-setting information items associated with the acquired plurality of model-information items, the one sound-setting information item corresponding to one type among the different types of the sound, the one type being indicated by one sound-type information item among the acquired sound-type information items; and processing, by the electronic apparatus, the audio signal in accordance with the selected one sound-setting information item, wherein processing of the audio signal by the electronic apparatus includes executing, in a stepwise manner on the audio signal to be subjected to the processes, one or more signal processes that have been selected from among a plurality of signal processes for executing different processes on the audio signal, the one or more signal processes including processing the audio signal in accordance respectively with given individual-setting information items, the plurality of sound-setting information items each including:

information that specifies the one or more signal processes, information that specifies an order of execution of the one or more signal processes on the audio signal, and the given individual-setting information items to be used respectively in the one or more signal processes, the method further comprising:

changing, by the electronic apparatus, a given at least one individual-setting information item among the given individual-setting information items in accordance with the instruction to be input, the given at least one individual-setting information item being used in an at least one signal process among the one or more signal processes;

acquiring, by the electronic apparatus, a sound-identification information item for identifying the audio signal to be subjected to the processes; and

causing, by the electronic apparatus, the changed at least one individual-setting information item to be stored in association with:

the acquired sound-identification information item, an acquired corresponding one model-information item among the acquired plurality of model-information items, and the selected one sound-setting information item, the changed at least one individual-setting information item has been changed in accordance with the instruction to be input, the processing of the audio signal by the electronic apparatus includes:

processing, in response to the changing of the given at least one individual-setting information item to be used in the at least one signal process, the audio signal in accordance with the changed at least one individual-setting information item in the at least one signal process, and processing, in a case where the changed at least one individual-setting information item has been stored in association with:

the acquired sound-identification information item, the acquired corresponding one model-information item, and the selected one sound-setting information item, and the audio signal with use of the stored changed at least one individual-setting information item instead of the given individual-setting information items included in the selected one sound-setting information item.

9. The method for processing the audio signal to be supplied to the device according to claim 6, wherein the acquiring of the plurality of model-information items by the electronic apparatus includes acquiring the plurality of model-information items on a basis of information received from the device via communication with the device.

10. The method for processing the audio signal to be supplied to the device according to claim 6, wherein the processing of the audio signal by the electronic apparatus includes causing an audio-signal processing module connected to the electronic apparatus to process the audio signal.

11. An electronic apparatus that processes an audio signal to be supplied to a device, and comprises:

a processing unit; and a storage unit that stores a program including a command which can be executed by the processing unit, the processing unit executing the program including the command to carry out the steps of the method for processing the audio signal to be supplied to the device according to claim 6.

* * * * *